(12) United States Patent
Kim et al.

(10) Patent No.: US 10,510,511 B2
(45) Date of Patent: Dec. 17, 2019

(54) APPARATUS FOR TREATING SUBSTRATE

(71) Applicant: SEMES CO., LTD., Chungcheongnam-do (KR)

(72) Inventors: Hyung Joon Kim, Gyeonggi-do (KR); Seung Kue Kim, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 253 days.

(21) Appl. No.: 14/528,120

(22) Filed: Oct. 30, 2014

(65) Prior Publication Data

US 2015/0114565 A1 Apr. 30, 2015

(30) Foreign Application Priority Data

Oct. 31, 2013 (KR) .................. 10-2013-0131346
Dec. 30, 2013 (KR) .................. 10-2013-0166499

(51) Int. Cl.
*H01J 37/32* (2006.01)

(52) U.S. Cl.
CPC .................. *H01J 37/321* (2013.01)

(58) Field of Classification Search
CPC .......... H01J 37/32009; H01J 37/32798; H01J 37/32119; H01J 37/321; H01J 37/32522
See application file for complete search history.

(56) References Cited

U.S. PATENT DOCUMENTS

| 2004/0083971 A1* | 5/2004 | Holland | H01J 37/321 |
| | | | 118/721 |
| 2007/0004208 A1* | 1/2007 | Ohkuni | C23F 4/00 |
| | | | 438/689 |
| 2007/0022954 A1* | 2/2007 | Iizuka | C23C 16/45565 |
| | | | 118/724 |
| 2009/0277897 A1* | 11/2009 | Lashmore | H01B 1/04 |
| | | | 219/544 |

FOREIGN PATENT DOCUMENTS

| CN | 1849034 A | 10/2006 |
| JP | 2003303812 A | * 10/2003 |
| JP | 2008159802 A | * 7/2008 |

(Continued)

OTHER PUBLICATIONS

Office Action for corresponding Chinese Application No. 201410601584.8 dated Jul. 7, 2016.

*Primary Examiner* — Yuechuan Yu
(74) *Attorney, Agent, or Firm* — Carter, Deluca & Farrell LLP

(57) ABSTRACT

Provided is an apparatus for treating a substrate which is capable of uniformly controlling a temperature of a support plate. The apparatus for treating the substrate includes a chamber having a treating space with an opened top surface, a support unit disposed within the chamber to support the substrate, a dielectric assembly disposed on the opened top surface of the chamber to cover the opened top surface, and a plasma source disposed above the dielectric assembly, the plasma source including an antenna generating plasma from (Continued)

a gas supplied into the chamber. The dielectric assembly includes a dielectric window, and heating units each of which is formed of a non-metallic material, the heating units being disposed on a top surface of the dielectric window to heat the dielectric window.

6 Claims, 6 Drawing Sheets

(56) References Cited

FOREIGN PATENT DOCUMENTS

| KR | 2003-0083683 A | | 10/2003 |
|---|---|---|---|
| KR | 2010-0100480 A | | 9/2010 |
| KR | 2011-0007251 A | | 1/2011 |
| KR | 2012-0069248 A | | 6/2012 |
| KR | 20120073884 A | * | 7/2012 |
| KR | 1020120073884 A | | 7/2012 |
| KR | 10-1249085 A | | 3/2013 |
| KR | 10-1315369 A | | 9/2013 |

* cited by examiner

APPARATUS FOR TREATING SUBSTRATE

CROSS-REFERENCE TO RELATED APPLICATIONS

This U.S. non-provisional patent application claims priority under 35 U.S.C. § 119 of Korean Patent Application Nos. 10-2013-0131346, filed on Oct. 31, 2013, and 10-2013-0166499, filed on Dec. 30, 2013, the entire contents of which are hereby incorporated by reference.

BACKGROUND OF THE INVENTION

The present invention disclosed herein relates to an apparatus for treating a substrate, and more particularly, to an apparatus for treating a substrate by using plasma.

Plasma generating devices include plasma enhanced chemical vapor deposition (PECVD) devices for depositing a thin film, etching devices for etching a deposited thin film to pattern the thin film, sputter devices, and ashing devices.

Such a plasma device is classified into a capacitively coupled plasma (CCP) device and an inductively coupled plasma (ICP) device according to a method of applying radio-frequency (RF) power. In the CCP device, RF power is applied into parallel plates and electrodes, which face each other, to generate plasma by using RF electric fields vertically formed between the electrodes. In the ICP device, a source material is converted into plasma by using induced electric fields induced by an antenna.

Since the typical ICP device includes the antenna having a coil shape, it is difficult to uniformly control an entire surface of a support plate disposed on a lower portion of the antenna at a high temperature. Also, since a heating member needs to be disposed on a side surface of the support plate due to interference with the antenna, it is difficult to uniformly control a temperature on the entire surface of the support plate.

SUMMARY OF THE INVENTION

The present invention provides an apparatus for treating a substrate which is capable of uniformly controlling a temperature of a support plate.

The feature of the present invention is not limited to the aforesaid, but other features not described herein will be clearly understood by those skilled in the art from descriptions below.

Embodiments of the present invention provide apparatuses for treating a substrate, the apparatuses including: a chamber having a treating space with an opened top surface; a support unit disposed within the chamber to support the substrate; a dielectric assembly disposed on the opened top surface of the chamber to cover the opened top surface; and a plasma source disposed above the dielectric assembly, the plasma source including an antenna generating plasma from a gas supplied into the chamber, wherein the dielectric assembly includes: a dielectric window; and heating units each of which is formed of a non-metallic material, the heating units being disposed on a top surface of the dielectric window to heat the dielectric window.

In some embodiments, when viewed from above, the dielectric window may be divided into a first area facing the antenna and a second area that does not face the antenna, and the heating units may be disposed on the second area.

In other embodiments, when viewed from above, the dielectric window may be divided into a first area facing the antenna and a second area that does not face the antenna, and the heating units may be independently controllable on the first and second areas.

In still other embodiments, the heating unit may include a thin carbon heater film.

In even other embodiments, the non-metallic material may include a carbon nano tube.

In yet other embodiments, the dielectric assembly may further include a cooling line cooling the dielectric window.

In further embodiments, the cooling line may face the antenna when viewed from above.

In still further embodiments, the heating units may be divided into a plurality of parts, and respective parts are independently controllable.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
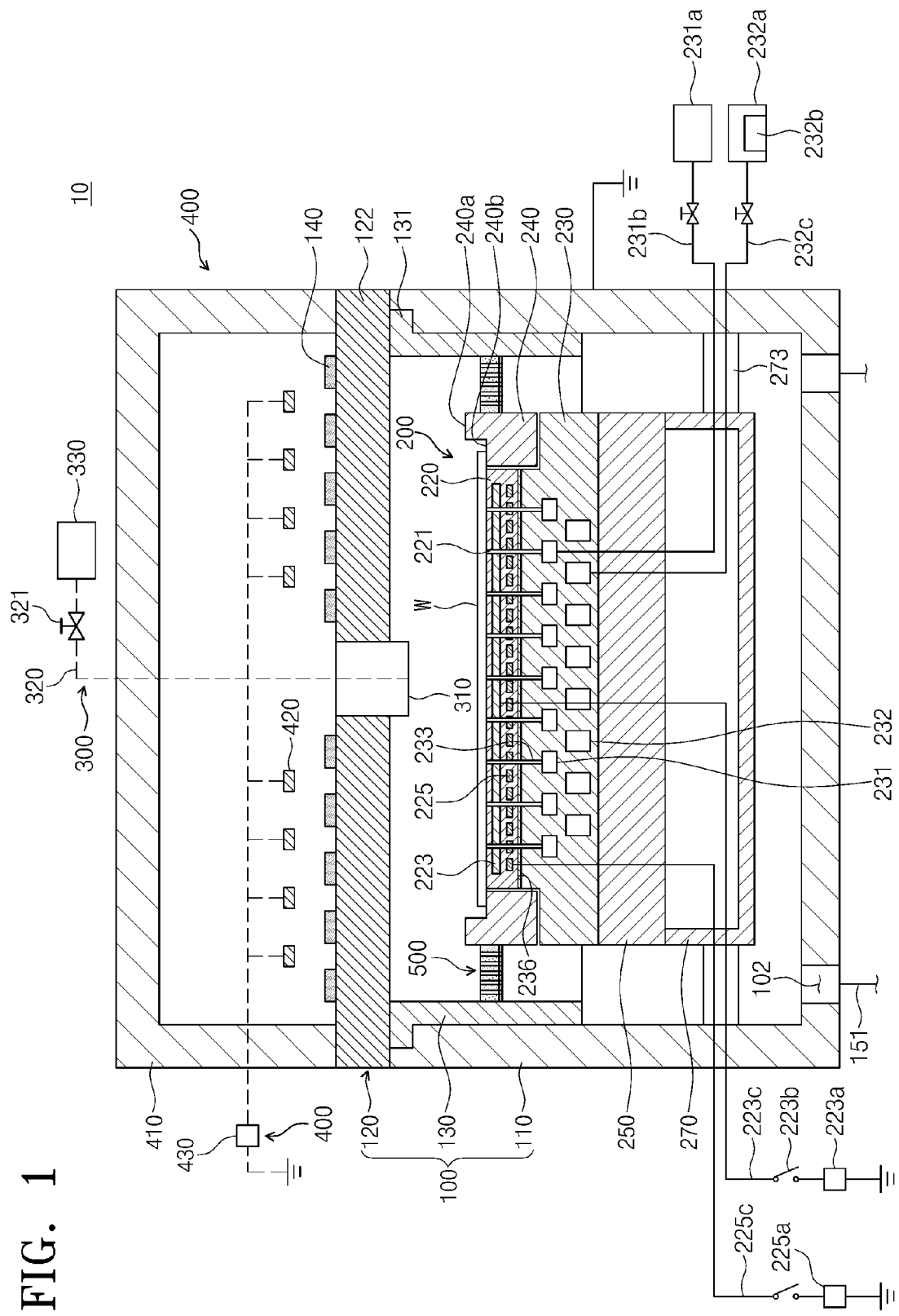
FIG. 1 is a cross-sectional view of an apparatus for treating a substrate according to an embodiment of the present invention.

Reference will now be made in detail to embodiments, examples of which are illustrated in the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

In the current embodiment of the present invention, a substrate treating apparatus for etching a substrate by using plasma will be described. However, the present invention is not limited to the above-described substrate treating apparatus. The present invention may be applied to various types of apparatuses performing processes by supplying plasma into chambers.

FIG. 1 is a cross-sectional view of an apparatus for treating a substrate according to an embodiment of the present invention.

Referring to FIG. 1, a substrate treating substrate 10 treats a substrate W by using plasma. For example, the substrate treating apparatus 10 may perform an etching process on the substrate W. The substrate treating apparatus 10 includes a chamber 100, a support unit 200, a gas supply unit 300, a plasma source 400, and a baffle unit 500.

The chamber 100 provides a space in which a substrate treating process is performed. The chamber 100 includes a housing 110, a dielectric assembly 120, and a liner 130.

The housing 110 has an inner space with an opened upper side. The inner space of the housing 110 is provided as a space in which the substrate treating process is performed. The housing 110 is formed of a metallic material. For example, the housing 110 may be formed of an aluminum material. The housing 110 may be grounded. An exhaust hole 102 is defined in a bottom surface of the housing 110. The exhaust hole 102 is connected to an exhaust line 151. Reaction byproducts generated during the process and gases staying in the housing 110 may be exhausted to the outside through the exhaust line 151.

Also, the inner space of the housing 110 is decompressed to a predetermined pressure by the exhausting process.

The liner 130 is disposed within the housing 110. The liner 130 has an inner space with opened top and bottom surfaces. For example, the liner 130 may have a cylindrical shape. The liner 130 may have a radius corresponding to that of an inner surface of the housing 110. The liner 130 may be disposed along the inner surface of the housing 110. A support ring 131 is disposed on an upper end of the liner 130. The support ring 131 may be provided as a plate having a ring shape. The support ring 131 protrudes outward from the liner 130 along a circumference of the liner 130. The support ring 131 is disposed on an upper end of the housing 110 to support the liner 130. The liner 130 may be formed of the same material as that of the housing 110.

For example, the liner 130 may be formed of an aluminum material. The liner 130 protects the inner surface of the housing 110. When a process gas is excited, arc discharge may occur within the chamber 100. The arc discharge may damage peripheral devices. The liner 130 may protect the inner surface of the housing 110 to prevent the inner surface of the housing 110 from being damaged by the arc discharge. Also, the liner 130 may prevent impurities generated during the substrate treating process from being deposited on an inner sidewall of the housing 110. The liner 130 may be inexpensive in manufacturing cost and easily replaced when compared to those of the housing 110. When the liner 130 is damaged by the arc discharge, a worker may replace the damaged liner 130 with a new liner 130.

The support unit 200 is disposed within the housing 110. The support unit 200 supports the substrate W. The support unit 200 may include an electrostatic chuck 210 for absorbing the substrate W by using an electrostatic force. Alternatively, the support unit 200 may support the substrate W through various methods such as mechanical clamping. Hereinafter, the support unit 200 including the electrostatic chuck 210 will be described.

The support unit 200 includes the electrostatic chuck 210, an insulation plate 250, and a lower cover 270. The support unit 200 is spaced upward from the bottom surface of the housing 110 within the chamber 100.

The electrostatic chuck 210 includes a support plate 220, an electrode 223, a heater 225, a base plate 230, and a focus ring 240.

The support plate 220 is disposed on an upper end of the electrostatic chuck 210. The support plate 220 has a circular shape and is formed of a dielectric substance. The substrate W is placed on a top surface of the support plate 220. The top surface of the support plate 220 has a radius less than that of the substrate W. Thus, the substrate W may have an edge area disposed outside the support plate 220.

A first supply passage 221 is defined in the support plate 220. The first supply passage 221 is defined from the top surface up to a bottom surface of the support plate 210. The first supply passage 221 may be provided in plurality. Also, the plurality of first supply passages 221 are spaced apart from each other. The first supply passage 221 serves as a passage through which a thermal transfer medium is supplied to a bottom surface of the substrate W.

A lower electrode 223 and a heater 225 are buried in the support plate 220. The lower electrode 223 is disposed above the heater 225. The lower electrode 223 is electrically connected to a first lower power source 223a. The first lower power source 223a may include a direct current (DC) power source. A switch 223b is disposed between the lower electrode 223 and the first lower power source 223a. The lower electrode 223 may be electrically connected to the first lower power source 223a through an ON/OFF operation of the switch 223b. When the switch 223b is turned on, DC current is applied into the lower electrode 223. The electrostatic force may act between the lower electrode 223 and the substrate W by the current applied into the lower electrode 223. Thus, the substrate W may be absorbed to the support plate 220 by the electrostatic force.

The heater 225 is electrically connected to a second lower power source 225a. The heater 225 may resist against current applied from the second lower power source 225a to generate heat. The generated heat may be transferred into the substrate W through the support plate 220. The substrate W may be maintained at a predetermined temperature by the heat generated in the heater 225. The heater 225 includes a spiral coil.

The base plate 230 is disposed under the support plate 220. A bottom surface of the support plate 220 and a top surface of the base plate 230 may adhere to each other by using an adhesive 236. The base plate 230 may be formed of an aluminum material. The base plate 230 may have a stepped portion so that a central area of the top surface thereof is disposed at a height greater than that of an edge area thereof. The central area of the top surface of the base plate 230 has a surface area corresponding to that of the bottom surface of the support plate 220 and adheres to the bottom surface of the support plate 220. A first circulation passage 231, a second circulation passage 232, and a second supply passage 233 are defined in the base plate 230.

The first circulation passage 231 provides a passage through which the thermal transfer medium is circulated. The first circulation passage 231 may be defined in a spiral shape within the base plate 230. Alternatively, the first circulation passage 231 may be provided so that ring-shaped passages having radii different from each other are concentrically disposed. In this case, the first circulation passages 231 may communicate with each other. The first circulation passages 231 may be defined at the same height.

The second circulation passage 232 provides a passage through which a cooling fluid is circulated. The second circulation passage 232 may be defined in a spiral shape within the base plate 230. Alternatively, the second circulation passage 232 may be provided so that ring-shaped passages having radii different from each other are concentrically disposed. In this case, the second circulation passages 232 may communicate with each other. The second circulation passage 232 may have a sectional area greater than that of the first circulation passage 231. The second circulation passages 232 may be defined at the same height. The second circulation passage 232 may be defined under the first circulation passage 231.

The second supply passage 233 extends upward from the first circulation passage 231 up to the top surface of the base plate 230. The second supply passage 233 may be provided in number corresponding to that of the first supply passage 221. The second supply passage 233 connects the first circulation passage 231 to the first supply passage 221.

The first circulation passage 231 is connected to a thermal transfer medium storage unit 231a through a thermal transfer medium supply line 231b. A thermal transfer medium is stored in the thermal transfer medium storage unit 231a. The thermal transfer medium includes an inert gas. According to an embodiment, the thermal transfer medium may include a helium (He) gas. The helium gas is supplied into the first circulation passage 231 through the thermal transfer medium supply line 231b. Then, the helium gas successively passes through the second supply passage 233 and the first supply passage 221 and then is supplied to the bottom surface of the substrate W. The helium gas may serve as a medium for transferring heat transferred from the plasma to the substrate W toward the electrostatic chuck 210.

The second circulation passage 232 is connected to a cooling fluid storage unit 232a through a cooling fluid supply line 232c. A cooling fluid is stored in the cooling fluid storage part 232a. A cooler 232b may be disposed within the cooling fluid storage unit 232a. The cooler 232b cools the cooling fluid to a predetermined temperature. Alternatively, the cooler 232b may be disposed on the cooling fluid supply line 232c. The cooling unit supplied into the second circulation passage 232 through the cooling fluid supply line 232c is circulated along the second circulation passage 232 to cool the base plate 230.

While the base plate 230 is cooled, the support plate 220 and the substrate W may be cooled together to maintain the substrate W at a predetermined temperature.

The focus ring 240 is disposed on an edge area of the electrostatic chuck 210. The focus ring 240 has a ring shape and is disposed along a circumference of the support plate 220. The focus ring 240 may have a stepped portion so that an outer portion 240a of a top surface thereof is disposed at a height greater than that of an inner portion 240b of the top surface. An inner portion 240b of the top surface of the focus ring 240 is disposed at the same height as that of the support plate 220. The inner portion 240b of the top surface of the focus ring 240 supports the edge area of the substrate W disposed outside the support plate 220. The outer portion 240a of the focus ring 240 surrounds the edge area of the substrate W. The focus ring 240 may focus the plasma into a region facing the substrate W within the chamber 100.

The insulation plate 250 is disposed under the base plate 230. The insulation plate 250 has a sectional area corresponding to that of the base plate 230. The insulation plate 250 is disposed between the base plate 230 and the lower cover 270. The insulation plate 250 is formed of an insulation material to electrically insulate the base plate 230 from the lower cover 270.

The lower cover 270 is disposed on a lower end of the support unit 200. The lower cover 270 is spaced upward from the bottom surface of the housing 110. The lower cover 270 has an inner space with an opened top surface. The top surface of the lower cover 270 is covered by the insulation plate 250. Thus, an external radius in a sectional area of the lower cover 270 may have the same length as that of the insulation plate 250. A lift pin module (not shown) for moving the carried substrate W from an external carrying member to the electrostatic chuck 210 may be disposed in the inner space of the lower cover 270.

The lower cover 270 includes a connection member 273. The connection member 273 connects an outer surface of the lower cover 270 to the inner sidewall of the housing 110. The connection member 273 may be provided in plurality. The plurality of connection members 273 may be disposed on the outer surface of the lower cover 270 at a predetermined distance. The connection member 273 supports the support unit 200 inside the chamber 100. Also, the connection member 273 may be connected to the inner sidewall of the housing 110 to allow the lower cover 270 to be electrically grounded.

A first power line 223c connected to the first lower power source 223a, a second power line 225c connected to the second lower power source 225a, the thermal transfer supply line 231b connected to the thermal transfer medium storage unit 231a, and the cooling fluid supply line 232c connected to the cooling fluid storage unit 232a may extend into the lower cover 270 through an inner space of the connection member 273.

The gas supply unit 300 supplies the process gas into the chamber 100. The gas supply unit 300 includes a gas supply nozzle 310, a gas supply line 320, and a gas storage unit 330. For example, the gas supply nozzle 310 may be disposed at the central portion of the dielectric assembly 120. An injection hole is defined in a bottom surface of the gas supply nozzle 310. The injection hole is defined in a lower portion of the sealing cover 120 to supply the process gas into the chamber 100. The gas supply line 320 connects the gas supply nozzle 310 to the gas storage unit 330. The gas supply line 320 supplies the process gas stored in the gas storage unit 330 into the gas supply nozzle 310. A valve 321 is disposed in the gas supply line 320. The valve 321 opens or closes the gas supply line 320 to adjust a flow rate of the process gas supplied through the gas supply line 320. Alternatively, the gas supply nozzle 310 may be disposed along an upper edge of the housing 110 not at the central portion of the dielectric assembly 120.

The plasma source 400 excites the process gas within the chamber 100 into a plasma state. An inductively coupled plasma (ICP) source may be used as the plasma source 400. The plasma source 400 may include an antenna chamber 410, an antenna 420, and a plasma power source 430. The antennal chamber 410 has a cylindrical shape with an opened lower side. The antennal chamber 410 has an inner space. The antennal chamber 410 may have a diameter corresponding to that of the chamber 100. The antennal chamber 410 may have a lower end detachably disposed on the dielectric assembly 120. The antenna 420 is disposed inside the antenna chamber 410. The antenna 420 may be provided as a spiral coil that is wound several times. The antenna 420 is connected to the plasma power source 430. The antenna 420 receives power from the plasma power source 430. The plasma power source 430 may be disposed outside the chamber 100. The antenna 420 to which the power is applied may generate electromagnetic fields in a processing space of the chamber 100. The process gas is excited into the plasma state by the electromagnetic fields.

The baffle unit 500 is disposed between the inner sidewall of the housing 110 and the support unit 200. The baffle unit 500 includes a body in which through holes are defined. The body of the baffle unit 500 has a ring shape. The process gas supplied into the housing 110 is exhausted through an exhaust hole 102 via the through holes of the baffle unit 500. A flow of the process gas may be controlled according to a shape of the baffle unit 500 and a shape of each of through holes.

Figure 2:
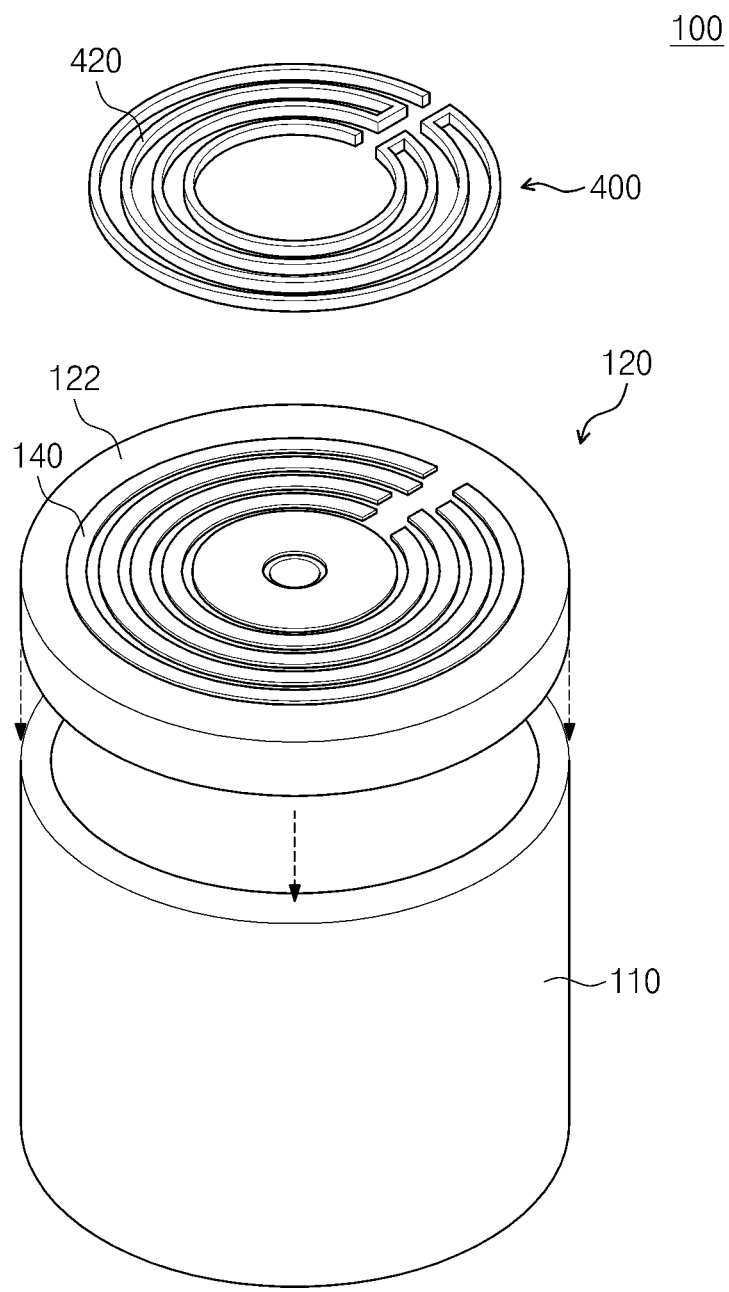
FIG. 2 is a perspective view of a chamber of FIG. 1.
Figure 3:
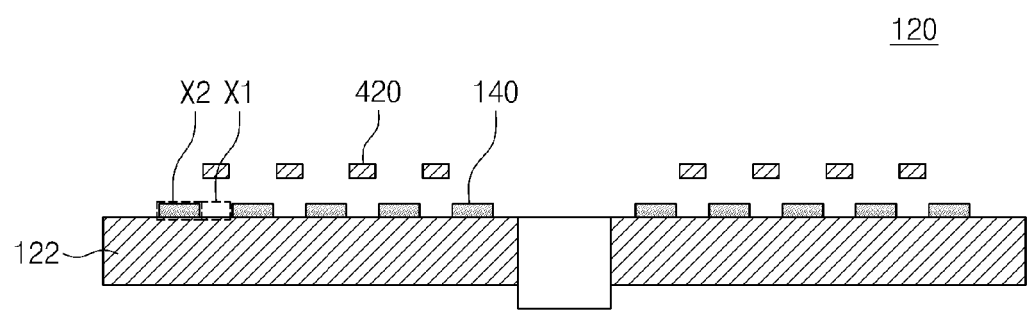
FIG. 3 is a cross-sectional view illustrating a dielectric assembly of FIG. 1.
Figure 4:
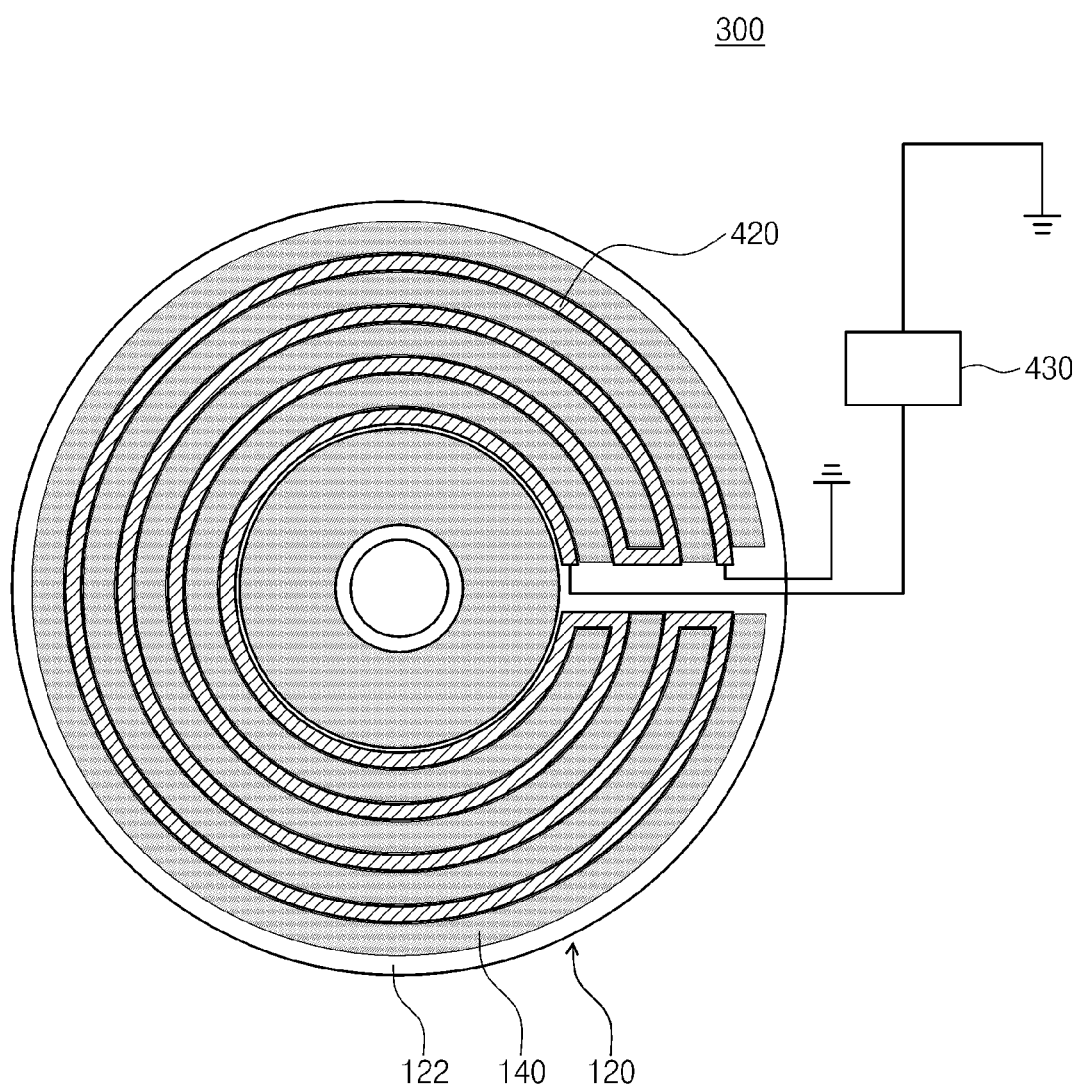
FIG. 4 is a plan view of the dielectric assembly.

FIG. 2 is a perspective view of a chamber of FIG. 1, FIG. 3 is a cross-sectional view illustrating a dielectric assembly of FIG. 1, and FIG. 4 is a plan view of the dielectric assembly.

Referring to FIGS. 1 to 4, the dielectric assembly 120 covers the opened top surface of the housing 110. The dielectric assembly 120 may be provided in a plate shape to seal the inner space of the housing 110. The dielectric assembly 120 may be separable.

The dielectric assembly 120 according to an embodiment of the present invention includes a dielectric window 122 and a heating unit 140 installed on a top surface of the dielectric window 122 so that radio-frequency (RF) power supplied from the plasma power source 430 into the antenna 420 is transmitted therethrough.

The dielectric window 122 may be formed of quartz glass or a ceramic insulating material such as aluminum nitride. An inductively coupled plasma (ICP) antenna 420 having a coil structure is disposed above the dielectric window 122. The dielectric window 122 has the same diameter as that of the housing 110.

The heating unit 140 heats the dielectric window 122. The heating unit 140 disposed on the dielectric window 122. Heat generated from the heating unit 140 is transferred into an entire dielectric assembly 120.

Although not shown, the dielectric window 122 onto which the heating unit 140 is installed may be surrounded by a coating film. The coating film is formed of a material having an excellent chemical resistance. For example, the coating film may be formed of Teflon.

The heating unit 140 may be provided in a thin film formed of a non-metallic material. For example, the heating unit 140 may be a thin carbon heater film using a carbon nano tube.

The heating unit 140 may be divided into a plurality of parts. Each of the plurality of parts may be independently controlled. For example, when viewed from above, the dielectric window 122 may be divided into a first area X1 facing the antenna 420 and a second area X2 that does not face the antenna 420. Here, the heating unit 140 may be provided on the second area X2. The reason why the heating unit 140 is not installed on the first area X1 facing the antenna 420 is that, when the RF power is applied into the antenna 420, heat is generated by self heat generation of the antenna and coupling effects due to induced magnetic fields. Thus, the first area X1 of the dielectric window 122 facing the antenna 420 increases in temperature. Thus, in order to uniform temperature dispersion of the dielectric window 122, the heating unit 140 may be installed on the only second area X2.

The heating unit 140 may heat the dielectric assembly 120 during or before the substrate treating process using the plasma. Thus, the dielectric assembly 122 may prevent a significant temperature change during the substrate treating process from occurring and may provide a uniform temperature gradient.

The cooling line 128 is disposed in the dielectric window 122. For example, the cooling line 128 may be buried in the dielectric window 122. The cooling line 128 cools the dielectric window 122. When viewed from above, the cooling line 128 may be disposed on the area X2 facing the area on which the antenna 420 is disposed.

Figure 5:
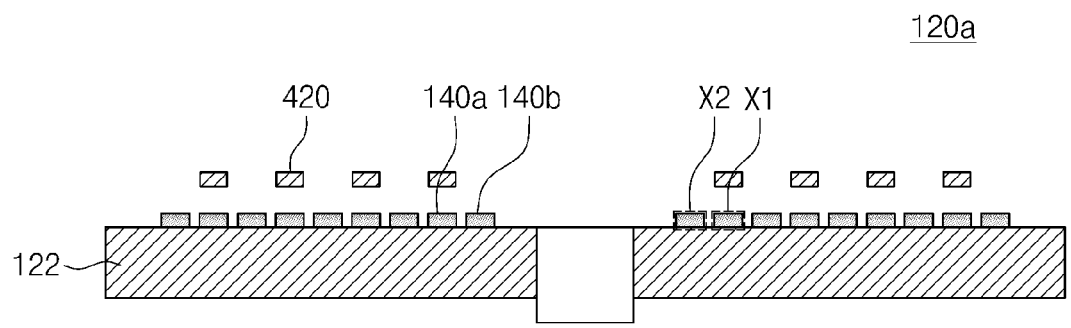
FIG. 5 is a cross-sectional view illustrating a modified example of the dielectric assembly.

FIG. 5 is a cross-sectional view illustrating a modified example of the dielectric assembly.

Referring to FIG. 5, the dielectric assembly 120a includes a dielectric window 122 and heating units 140a and 140b disposed on the top surface of the dielectric window 122.

However, the heating units 140a and 140b may be disposed on the first area X1 facing the antenna 420 and the second area that does not face the antenna 420, respectively. The heating units 140a and 140b respectively disposed on the first and second areas may be independently controlled.

Figure 6:
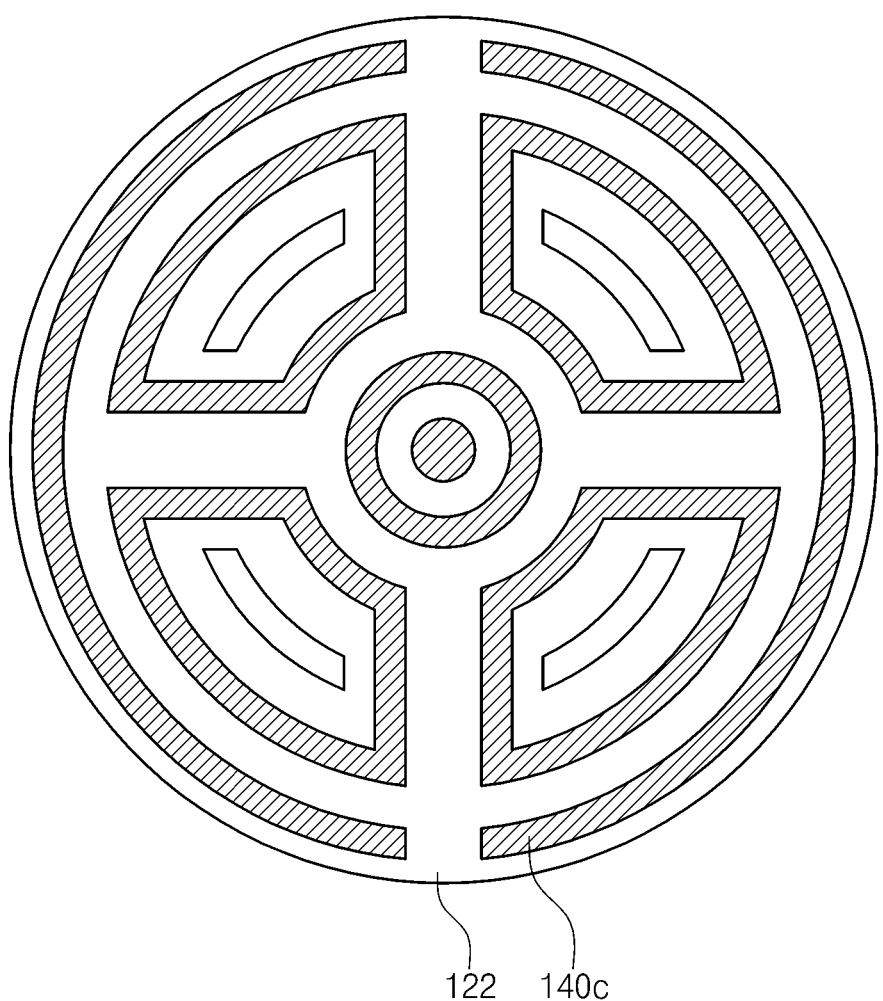
FIG. 6 is a view illustrating various types of heating units.

FIG. 6 is a view illustrating various types of heating units.

As illustrated in FIG. 6, the heating unit 140c may be variously changed in shape according to a size and shape of the antenna and an area to be controlled in plasma density.

According to an embodiment of the present invention, the non-metallic heater may be applied to minimize the coupling effect due to the RF power applied into the upper antenna.

According to an embodiment of the present invention, since the heating areas are individually provided in consideration of the shape of the antenna, the temperature gradient between the heat generation portion of the lower portion of the antenna and other areas may be matched to each other.

The feature of the present invention is not limited to the aforesaid, but other features not described herein will be clearly understood by those skilled in the art from this specification and the accompanying drawings.

The foregoing detailed descriptions may be merely an example of the inventive concept. Further, the above contents just illustrate and describe preferred embodiments of the inventive concept and the inventive concept can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents. Further, the appended claims should be appreciated as a step including even another embodiment.

What is claimed is:

1. An apparatus for treating a substrate, the apparatus comprising:
   a chamber having a treating space with an opened top surface;
   a support unit disposed within the chamber to support the substrate;
   a dielectric assembly disposed on the opened top surface of the chamber to cover the opened top surface; and
   a plasma source disposed above the dielectric assembly, the plasma source comprising an annular shaped antenna configured to generate plasma from a gas supplied into the chamber,
   wherein the dielectric assembly comprises:
      a dielectric window; and
      heating units each of which is formed of a non-metallic material, the heating units being separated and annular shaped and disposed on a top surface of the dielectric window and interspersed in concentric relation about a central axis defined by the apparatus to heat the dielectric window, wherein the annular shaped antenna is in a higher position than the heating units,
   wherein a top surface of the dielectric window is divided into a first area facing the annular shaped antenna and a second area not facing the annular shaped antenna,
   wherein all areas of the top surface of the dielectric window, which face the annular shaped antenna when viewed from above, are the first area,
   wherein when viewed from above, the heating units are disposed on the second area and not on the first area,
   wherein when viewed from above, an annular shape of an outermost heating unit of the heating units abuts and surrounds an annular shape of an outermost part of the annular shaped antenna and annular shapes of heating units other than the outermost heating unit abut the annular shaped antenna.

2. The apparatus of claim 1, wherein each of the heating units comprises a thin carbon heater film.

3. The apparatus of claim 1, wherein the non-metallic material comprises a carbon nano tube.

4. The apparatus of claim 1, wherein the dielectric assembly further comprises a cooling line cooling the dielectric window.

5. The apparatus of claim 4, wherein the cooling line faces the annular shaped antenna when viewed from above.

6. The apparatus of claim 1, wherein the heating units are divided into a plurality of parts, and respective parts are independently controllable.

* * * * *